United States Patent [19]
Quah et al.

[11] Patent Number: 5,732,450
[45] Date of Patent: Mar. 31, 1998

[54] RESILIENT SNAP FITMENT MEMBER

[75] Inventors: Tee Hoh Quah, Penang; Seong Jin Lim, Georgetown; Mohamad Fauzi Yahaya, Bayan Lepas, all of Malaysia

[73] Assignee: Motorola, Inc., Schaumburg, Ill.

[21] Appl. No.: 796,354

[22] Filed: Feb. 7, 1997

[30] Foreign Application Priority Data

Jan. 31, 1996 [MY] Malaysia ............... PI 9600368

[51] Int. Cl.$^6$ ............... F16B 19/00; H05K 7/12; A44B 17/00
[52] U.S. Cl. ............... 24/297; 24/531; 24/289
[58] Field of Search ............... 24/289, 292, 297, 24/305, 531, 545; 411/508, 913; 52/717.01, 716.1

[56] References Cited

U.S. PATENT DOCUMENTS

| | | | |
|---|---|---|---|
| 3,581,428 | 6/1971 | Helder | 24/531 X |
| 4,393,561 | 7/1983 | Yuda | 24/297 |
| 4,422,222 | 12/1983 | Notoya | 24/297 X |
| 4,579,478 | 4/1986 | Takahashi | 24/297 X |
| 4,644,614 | 2/1987 | Mizusawa | 24/297 X |
| 4,712,939 | 12/1987 | Fujimoto | 24/297 X |
| 4,766,652 | 8/1988 | Sugiura | 24/297 X |
| 4,856,151 | 8/1989 | Fujimoto | 24/297 X |
| 5,155,887 | 10/1992 | Stahl | 24/297 |
| 5,452,184 | 9/1995 | Scholder et al. | 24/297 X |
| 5,469,606 | 11/1995 | Hansen | 24/297 X |

FOREIGN PATENT DOCUMENTS 147514  4/1969  Germany ............... 24/289

*Primary Examiner*—James R. Brittain
*Assistant Examiner*—Robert J. Sandy
*Attorney, Agent, or Firm*—Glenn E. Gold

[57] ABSTRACT

A resilient snap fitment member comprising a first spacing member extending from a surface of a mount. A lateral member extends from the first spacing member and is spaced from the mount. A second spacing member extends from the lateral member in the direction away from the surface and a cantilevered abutment member extends from the second spacing member co-acting with the mount to capture a mountable member such as a printed circuit board.

10 Claims, 3 Drawing Sheets

RESILIENT SNAP FITMENT MEMBER

TECHNICAL FIELD

This invention relates to a resilient snap fitment member particularly useful for, but not necessarily limited to, mounting components such as printed circuit boards and the like.

BACKGROUND

In an assembly process the mounting of components such as printed circuit boards to a mount often requires the use of attachment devices such as screws or rivets. However, the use of such attachment devices during assembly can be labor intensive and time consuming.

Adhesives have also been used for mounting components to a mount. The use of adhesives in the assembly process is less labor intensive than using screws or rivets. Unfortunately, the application of adhesives requires accurate alignment, precise adhesive application and careful handling of the mount and components until the adhesive sets. Further, once the adhesive has set the removal of components from the mount is not usually possible without damaging the mount or components.

To overcome the problems associated with the attachment devices and adhesives in the assembly process, snap fitments have been developed such as described in U.S Pat. No. 4,609,119. Unfortunately, during the assembly process such snap fitments require components to be accurately aligned with little tolerance variations otherwise damaged may occur to either the snap fitment or the component. This therefore, can result in reduced yield.

Alternatively, the assembly process can be operated at a speed slow enough to ensure accurate alignment of components. This however has the disadvantage of lower productivity in the assembly process.

SUMMARY OF THE INVENTION

It is an aim of the invention to overcome or alleviate at least one of the problems associated with the snap fitment members.

According to one aspect of the invention there is provided a resilient snap fitment member comprising:

a first spacing member extending from a surface of a mount;

a lateral member extending from said first spacing member at a section thereof spaced from said mount;

a second spacing member extending from said lateral member in the direction away from said surface; and a cantilevered abutment member extending from said second spacing member, said cantilevered abutment member being adapted to co-act with said mount to capture a mountable member therebetween.

Preferably, said lateral member is normal to said first spacing member.

Suitably, said lateral member is normal to said second spacing member.

Preferably, there may be a movement restriction member protruding from said lateral member towards said surface.

In an alternative form said movement restriction member may protrude from said surface towards said lateral member.

In yet a further alternative form said lateral member and said surface may be in close proximity to thereby limit movement therebetween.

Preferably there may be another movement restriction member protruding from said lateral member towards said cantilevered abutment member.

In an alternative form the another movement restriction member may protrude from said cantilevered abutment member towards said lateral member.

In yet a further alternative form said lateral member and said cantilevered abutment member may be in close proximity to thereby limit movement therebetween.

Suitably, there may be an engagement means adjacent at free end of said cantilevered abutment member for complimentary engagement with the mountable member.

Preferably, said engagement means may be a socket for complimentary engagement with said mountable member.

In an alternative preferable form, said engagement means is a spigot for complementary engagement with said mountable member.

Suitably, there may be a strengthening rib extending from said second member for strengthening said cantilevered section.

The resilient snap fitment member may be integrally formed.

Preferably, the resilient snap fitment member is integral with said mount.

BRIEF DESCRIPTION OF THE DRAWINGS

In order that the invention may be readily understood and put into practical affect, reference will now be made to preferred embodiments as illustrated with reference to the accompanying drawings in which.

DETAILED DESCRIPTION OF THE PREFERRED EMBODIMENT

Figure 1:
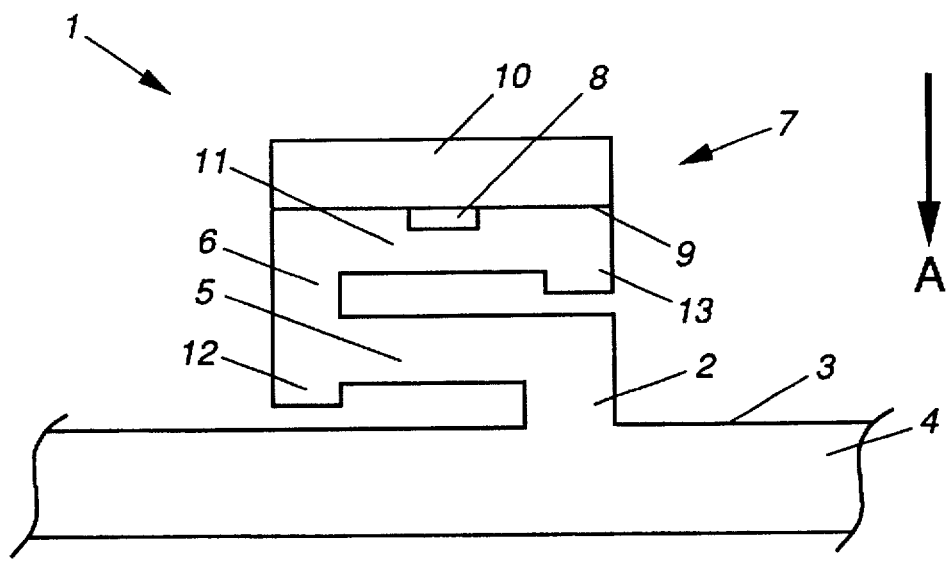
FIG. 1 is a front view illustrating a first embodiment of a front view of a resilient snap, fitment member in accordance with the invention.
Figure 2:
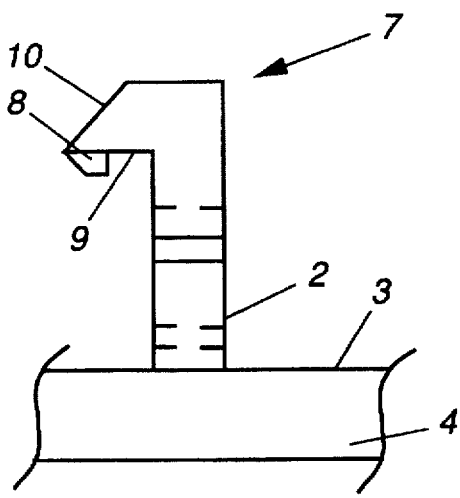
FIG. 2 is a side view of the resilient snap fitment member of FIG. 1.
Figure 3:
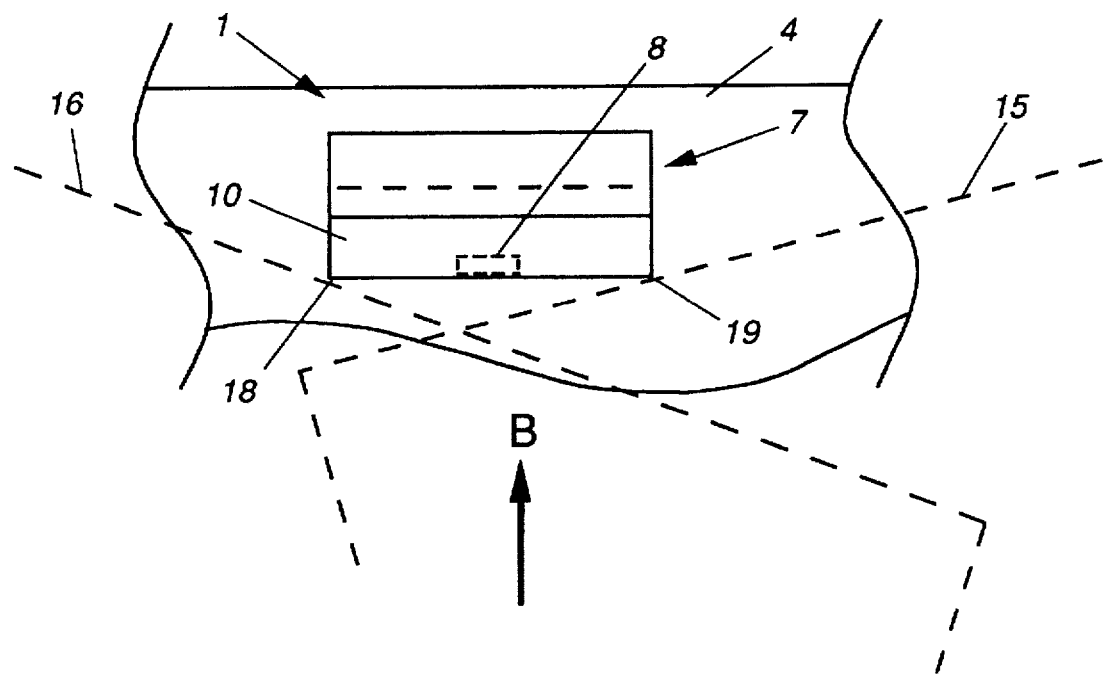
FIG. 3 is a plan view illustrating a resilient snap fitment member of FIG. 1.

Referring to FIGS. 1-3 there is illustrated an integrally formed resilient snap fitment member 1 comprising a first spacing member 2 extending from a surface 3 of a mount 4. Snap fitment member 1 also includes a lateral member 5 extending normally from first spacing member 2 and a second spacing member 6 extending from a free end of lateral member 5 in the direction away from surface 3.

A cantilevered abutment member 7 extends from second spacing member 6 and is adapted to co-act with surface 3 to capture a mountable member such as, for example, a printed circuit board 15.

Cantilevered abutment member 7 has a taper 10 at an upper side and at an underside surface 9 of a abutment member 7 there is a spigot 8 extending towards surface 3. Further, cantilevered abutment member 7 also has a strengthening rib extending from second member 6.

Protruding from lateral member 5 towards surface 3 is a movement restriction member 12. There is also another movement restriction member 13 protruding from cantilevered abutment member towards lateral member 5.

In use, resilient snap fitment member 1 has the advantage of allowing, for instance, a printed circuit board 15 to be mounted to mount 4 without the need for accurate alignment. In this regard an edge of printed circuit board 15 engages along the length of taper 10 and therefore by pushing circuit board 15 in a direction towards mount 4 will cause flexing of snap fitment member 1 away from a normal position as illustrated.

When circuit board 15 passes underside surface 9 snap fitment member 1 will flex back to its normal position thereby capturing printed circuit board 15 between mount 4 and underside surface 9. If required spigot 8 may engage with an aperture in board 15 to provide additional securement.

The present invention has the advantage of reducing or eliminating damage to, for example, printed circuit board 15 by misalignment as specifically illustrated in FIG. 3. In this regard if printed circuit board 15 is misaligned, as illustrated, a twisting force in the direction of arrow B will be applied to a corner 19 of resilient snap fitment member 1. Advantageously, fitment member 1 will pivot about second spacing member 6 and therefore damage to the printed circuit board 15 and fitment member 1 will be eliminated or at least reduced.

Alternatively, if printed circuit board 16 is misaligned, as illustrated, a twisting force in the direction of arrow B will be applied to a corner 18 of resilient snap fitment member 1. Advantageously, resilient snap fitment member 1 will pivot about first spacing member 2 and therefore damage to printed circuit board 16 and fitment member 1 will be eliminated or at least reduced.

Another advantage of the present invention is that during insertion of, for example, printed circuit board 15, movement restriction members 12, 13 limits movement of cantilevered abutment member 7 and lateral member 5 in the direction of arrow A towards surface 3. This therefore limits the compression of fitment member 1 during insertion of printed circuit board 15.

Figure 4:
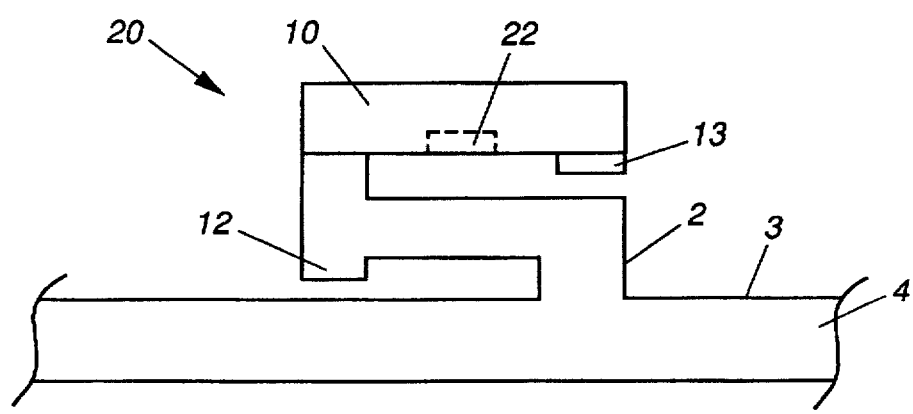
FIG. 4 is a front view of the second preferred embodiment of a snap fitment member in accordance with the invention.
Figure 5:
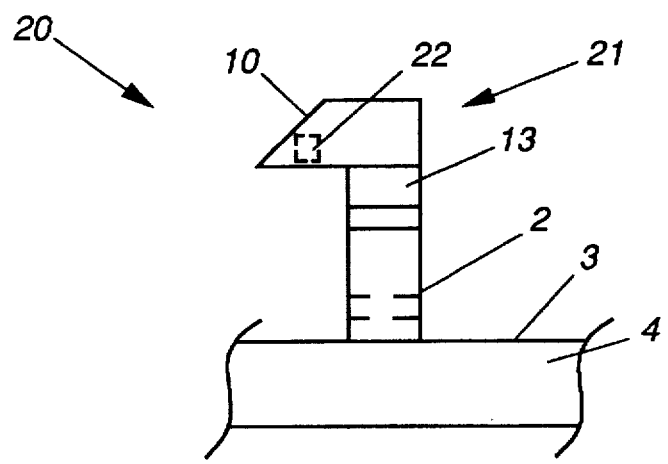
FIG. 5 is a side view of the resilient snap fitment member of FIG. 4.

Referring to FIGS. 4 and 5 there is a illustrated a second preferred embodiment of the present invention. As illustrated, there is a resilient snap fitment member 20 similar to that of resilient snap fitment member 1 and thereby only the differences will be described. In this regard spigot 8 is replaced with a socket 22 and strengthening rib 11 is removed.

The embodiment of the present invention as illustrated in FIGS. 3 and 4 functions in a similar manner to that of the embodiment as described in FIGS. 1 to 3. This therefore provides the same advantages regarding misalignment and compression during mounting of components.

Although the invention has been described with reference to preferred embodiments it is to be understood that the invention is not restricted to any one of the embodiments described herein. For example, restriction members 12 and 13 may be removed and cantilevered abutment member 7 may be in close proximity to lateral member 5 to limit movement therebetween. Similarly, lateral member 5 may be in close proximity to surface 3 to limit movement therebetween.

What is claimed is:

1. A resilient snap fitment member comprising:

a first spacing member extending from a surface of a mount;

a lateral member extending from said first spacing member at a section thereof spaced from said mount;

a second spacing member extending from said lateral member in the direction away from said surface;

a cantilevered abutment member extending from said second spacing member, said cantilevered abutment member being adapted to co-act with said mount to capture a mountable member therebetween; and an engagement means adjacent a free end of said cantilevered abutment member for complimentary engagement with the mountable member.

2. A resilient snap fitment member as claimed in claim 1, wherein said lateral member is normal to said first spacing member.

3. A resilient snap fitment member as claimed in claim 1, wherein said lateral member is normal to said second spacing member.

4. A resilient snap fitment member as claimed in claim 1, wherein a movement restriction member protrudes from said lateral member towards said surface.

5. A resilient snap fitment member as claimed in claim 1, wherein a movement restriction member protrudes from said surface towards said lateral member.

6. A resilient snap fitment member as claimed in claim 5, wherein another movement restriction member protrudes from said lateral member towards said cantilevered abutment member.

7. A resilient snap fitment member as claimed in claim 5, wherein another movement restriction member protrudes from said cantilevered abutment member towards said lateral member.

8. A resilient snap fitment member comprising:

a first spacing member extending from a surface of a mount;

a lateral member extending from said first spacing member at a section thereof spaced from said mount:

a second spacing member extending from said lateral member in the direction away from said surface;

a cantilevered abutment member extending from said second spacing member, said cantilevered abutment member being adapted to co-act with said mount to capture a mountable member therebetween; and a strengthening rib extending from said second member for strengthening said cantilevered section.

9. A resilient snap fitment member as claimed in claim 1, wherein said engagement means comprises at least one spigot for engaging with an aperture in the mountable member.

10. A resilient snap fitment member as claimed in claim 1, wherein said engagement means comprises at least one socket for engaging with a spigot on the mountable member.

* * * * *